(12) United States Patent
Bhakta et al.

(10) Patent No.: US 12,289,114 B2
(45) Date of Patent: Apr. 29, 2025

(54) METHODS AND APPARATUS TO RETIME DATA USING A PROGRAMMABLE DELAY

(71) Applicant: Texas Instruments Incorporated, Dallas, TX (US)

(72) Inventors: Bhavesh G. Bhakta, Richardson, TX (US); Venkateswara Reddy Pothireddy, McKinney, TX (US); Abhijit Kumar Das, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/678,824

(22) Filed: May 30, 2024

(65) Prior Publication Data

US 2024/0313786 A1    Sep. 19, 2024

Related U.S. Application Data

(63) Continuation of application No. 18/115,682, filed on Feb. 28, 2023, now Pat. No. 12,028,079.

(60) Provisional application No. 63/344,663, filed on May 23, 2022.

(51) Int. Cl.
*H03L 7/081* (2006.01)
*H03L 7/085* (2006.01)

(52) U.S. Cl.
CPC .......... *H03L 7/0818* (2013.01); *H03L 7/0814* (2013.01); *H03L 7/0816* (2013.01); *H03L 7/085* (2013.01)

(58) Field of Classification Search
CPC ... H03L 7/0818; H03L 7/0814; H03L 7/0816; H03L 7/085
See application file for complete search history.

(56) References Cited

U.S. PATENT DOCUMENTS

| | | | | |
|---|---|---|---|---|
| 9,875,330 | B2* | 1/2018 | Ganusov | G06F 30/343 |
| 10,680,620 | B2* | 6/2020 | Huang | H03L 7/193 |
| 10,965,292 | B1* | 3/2021 | Okuno | H03L 7/0816 |
| 11,489,657 | B1* | 11/2022 | Lin | H04L 25/03057 |
| 11,545,981 | B1* | 1/2023 | Xanthopoulos | G06F 1/10 |
| 11,569,804 | B1* | 1/2023 | Lee | H03K 5/01 |
| 11,799,463 | B2* | 10/2023 | Choi | G11C 8/10 |
| 11,902,059 | B2* | 2/2024 | Zhong | H04B 1/10 |
| 2002/0146084 | A1* | 10/2002 | Cranford, Jr. | H04L 7/0337 375/360 |

(Continued)

*Primary Examiner* — Adam D Houston
(74) *Attorney, Agent, or Firm* — Michelle F. Murray; Frank D. Cimino

(57) ABSTRACT

An example system includes a controller having a first controller terminal, a second controller terminal, and a third controller terminal and digitally locked loop (DLL) circuitry having a first DLL terminal and a second DLL terminal, the first DLL terminal coupled to the first controller terminal. The system also includes first retimer circuitry having a first retimer terminal, and a second retimer terminal, and a third retimer terminal, the first retimer terminal coupled to the second DLL terminal and the second retimer terminal coupled to the second controller terminal and second retimer circuitry having a fourth retimer terminal, a fifth retimer terminal, and a sixth retimer terminal, the fourth retimer terminal coupled to the second DLL terminal and the fifth retimer terminal coupled to the third controller terminal.

20 Claims, 7 Drawing Sheets

(56) References Cited

U.S. PATENT DOCUMENTS

| | | | |
|---|---|---|---|
| 2013/0214959 A1* | 8/2013 | Lee | H03M 1/50 |
| | | | 341/166 |
| 2014/0203798 A1* | 7/2014 | O'Mahony | G01R 31/31726 |
| | | | 324/76.82 |
| 2019/0007055 A1* | 1/2019 | Nelson | H03L 7/0807 |
| 2019/0163228 A1* | 5/2019 | Gupta | G06F 1/12 |
| 2021/0358534 A1* | 11/2021 | Choi | H03L 7/0816 |
| 2022/0045668 A1* | 2/2022 | Chou | H03K 5/131 |
| 2023/0089517 A1* | 3/2023 | Passamani | G06F 1/08 |
| | | | 713/500 |
| 2023/0109641 A1* | 4/2023 | Passamani | H03K 5/05 |
| | | | 327/156 |
| 2023/0216512 A1* | 7/2023 | Rahman | H03L 7/087 |
| | | | 327/158 |
| 2023/0378961 A1* | 11/2023 | Bhakta | H03L 7/0818 |
| 2024/0313786 A1* | 9/2024 | Bhakta | H03L 7/0816 |

* cited by examiner

METHODS AND APPARATUS TO RETIME DATA USING A PROGRAMMABLE DELAY

CROSS-REFERENCE TO RELATED APPLICATION

This patent application is a continuation of U.S. patent Ser. No. 18/115,682 filed Feb. 28, 2023, which claims the benefit of and priority to U.S. Provisional Patent Application Ser. No. 63/344,663 filed May 23, 2022, which applications are hereby incorporated herein by reference in their entireties.

TECHNICAL FIELD

This description relates generally to retimer circuitry, and more particularly to methods and apparatus to retime data using a programmable delay.

BACKGROUND

As digital circuitry becomes increasingly complex, digital transmission speeds continue to increase. Circuitry capable of accurately transmitting and receiving data becomes increasingly complex as transmission speeds continue to increase. De-skew circuitry has become increasingly common in relatively high-speed digital transmissions. De-skew circuitry allows a first device to add a delay to data streams, which typically increases an accuracy of receiver circuitry at a second device. Configurable de-skew circuitry is typically capable of individually delaying data streams to mitigate transmission effects that result in accurate data reception. Placing de-skew circuitry between transmitter circuitry of a first device and receiver circuitry of a second device reduces data communication errors between the first and second devices.

SUMMARY

An example circuit includes a first flip-flop having a first flip-flop terminal, a second flip-flop terminal, and a third flip-flop terminal and first delay circuitry having a first delay terminal and a second delay terminal, the first delay terminal coupled to the second flip-flop terminal. The circuit also includes second delay circuitry having a third delay terminal and a fourth delay terminal and a second flip-flop having a fourth flip-flop terminal, a fifth flip-flop terminal, and a sixth flip-flop terminal, the fourth flip-flop terminal coupled to the second delay terminal and the fifth flip-flop terminal coupled to the fourth delay terminal. Additionally, the circuit includes a third flip-flop having a seventh flip-flop terminal, an eighth flip-flop terminal, and a ninth flip-flop terminal, the seventh flip-flop terminal coupled to the fifth flip-flop terminal and the ninth flip-flop terminal coupled to the fourth delay terminal and a multiplexer having a first multiplexer input, a second multiplexer input, and a multiplexer output, the first multiplexer input coupled to the fifth flip-flop terminal and the second multiplexer input coupled to the eighth flip-flop terminal.

An example method includes setting, by a transmitter, a retimer circuitry to have a first delay and transmitting, by the transmitter to a receiver, first test data comprising sending the first test data to the retimer circuitry while the retimer circuitry has the first delay. The method also includes determining, by the transmitter, success of transmitting the first test data and setting, by the transmitter, the retimer circuitry to have a second delay, after transmitting the first test data. Additionally, the method includes transmitting, by the transmitter to the receiver, second test data comprising transmitting the second test data to the retimer circuitry while the retimer circuitry has the second delay and determining, by the transmitter, success of transmitting the second test data. Also, the method includes setting, by the transmitter, the retimer circuitry to have a determined delay based on the success of transmitting the first test data and the success of transmitting the second test data.

An example system includes a controller having a first controller terminal, a second controller terminal, and a third controller terminal and digitally locked loop (DLL) circuitry having a first DLL terminal and a second DLL terminal, the first DLL terminal coupled to the first controller terminal. The system also includes first retimer circuitry having a first retimer terminal, and a second retimer terminal, and a third retimer terminal, the first retimer terminal coupled to the second DLL terminal and the second retimer terminal coupled to the second controller terminal and second retimer circuitry having a fourth retimer terminal, a fifth retimer terminal, and a sixth retimer terminal, the fourth retimer terminal coupled to the second DLL terminal and the fifth retimer terminal coupled to the third controller terminal.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
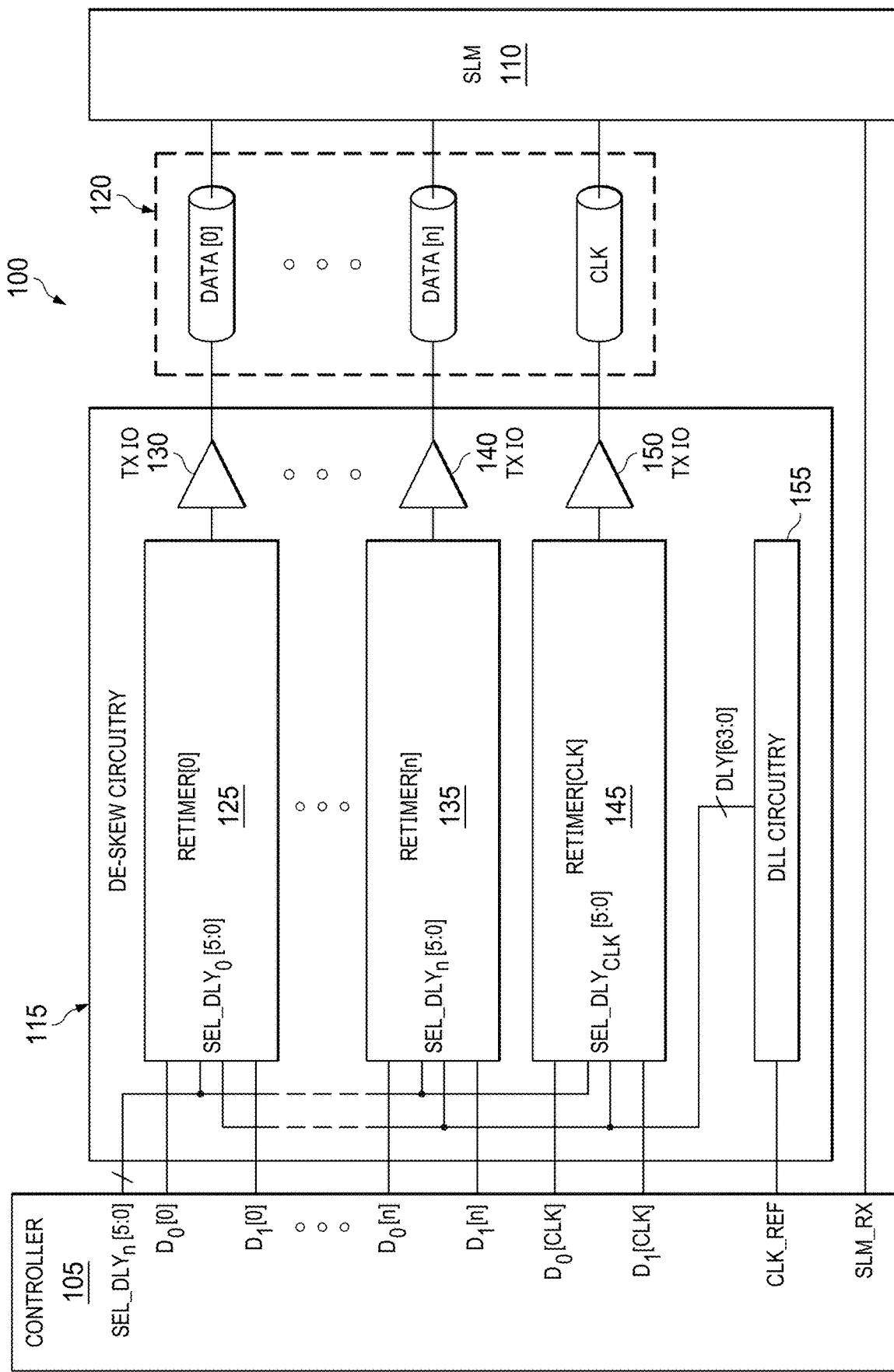
FIG. 1 is a block diagram of example de-skew circuitry including delay locked loop circuitry and retimer circuitry configured to add a programmable delay to data transmissions.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Digital systems are becoming increasingly complex. As data rates and digital BUS sizes continue to increase, a need for increasingly accurate timing circuitry has become common. Electrical characteristics of an electrical connection (e.g., a trace, a connector, a wire, etc.) between transmission circuitry and receiver circuitry cause data errors, such as skew, during transmission. As data rates continue to increase, data transmissions are more prone to data errors which result in receiving incorrect data.

Relatively high-speed digital devices may include de-skew circuitry to mitigate transmission effects. De-skew circuitry adds a delay to a data transmission to increase a likelihood that receiver circuitry accurately clocks received data.

De-skew circuitry includes multiple instances of retimer circuitry, such as one instance of the retimer circuitry per data stream, and circuitry to generate a plurality of delayed clocks. In some examples, delay is added by the retimer circuitry. Such a delay of the retimer circuitry is typically configurable. Accordingly, configuring a delay of each instance of the retimer circuitry to account for errors mitigates transmission effects. One method of configuring a delay of retimer circuitry involves sending a test data stream at each possible delay and determining which of the possible delays corresponds to the least number of errors when the test data stream is received. For example, retimer circuitry is configured to a first delay when the first delay corresponds to one bit of a test data stream not being received while a second delay corresponds to two bits not being received. In such an example, the first delay optimizes timing margins which results in fewer bits not being received.

Typically, possible delays of retimer circuitry depend on an ability to generate and/or modify a plurality of delayed clocks. One method includes using a controlling digitally locked loop (DLL) and a controlled DLL. The controlling DLL generates a reference voltage which causes a plurality of buffers to delay a reference clock by up to one cycle. A controlled DLL including eight buffers generates eight possible delayed clocks when the reference voltage from the controlling DLL supplies power to the eight buffers. Such buffers may be referred to as voltage controlled buffers. A number of possible delays of the retimer circuitry may be increased by including additional buffers. However, additional buffers increase power consumption even if the delay corresponding to the buffer is not being used.

De-skew circuitry that uses the controlling DLL and controlled DLL method, includes one controlling DLL to generate the reference voltage and a controlled DLL for each retimed data stream in addition to one more additional controlled DLL for a retimed clock signal. For example, de-skew circuitry includes one controlling DLL and nine controlled DLLs when the transmitter circuitry transmits eight data streams and one clock signal. Such a method of using a controlling DLL and controlled DLLs to generate possible delays has a relatively high power consumption and increases a system-on-chip size of the de-skew circuitry in response to a relatively large number of voltage controlled buffers.

The examples described herein include example de-skew circuitry capable of adding a configurable delay to a plurality of data streams using a reduced number of voltage controlled buffers. In some described examples, an example process of configuring delays of retimer circuitry comprising the de-skew circuitry is described to reduce glitches in retimed data streams. Further, the described retimer circuitry serializes two input data streams and adds a configurable delay to the serialized data stream. In some described examples, the de-skew circuitry includes circuitry configured to delay data transmission less than one clock cycle of a reference clock, while other examples include additional circuitry to delay data transmission by more than one clock cycle of the reference clock.

Advantageously, the described de-skew circuitry consumes less power as a result of using a single instance of DLL circuitry to generate possible delays. Advantageously, the described de-skew circuitry has a relatively smaller system on chip (SoC) size. Advantageously, the serializing performed by the de-skew circuitry allows input data streams to be of a relatively lower frequency, which is less prone to errors and may decrease overall cost.

FIG. 1 is a block diagram of an example communication system 100 configured to transmit data from an example controller 105 to an example spatial light modulator (SLM) 110. In the example of FIG. 1, the communication system 100 includes the controller 105, the SLM 110, example de-skew circuitry 115, and example transmission lines 120. The controller 105 transmits data to the SLM 110 using the de-skew circuitry 115 and the transmission lines 120. The de-skew circuitry 115 serializes and adds a configurable delay to transmissions from the controller 105 to reduce data errors received at the SLM 110.

The controller 105 is coupled to the SLM 110 and the de-skew circuitry 115. The controller 105 generates a reference clock (CLK_REF), a plurality of data streams ($D_0$[n:0] and $D_1$[n:0]), a plurality of clock data streams ($D_0$[CLK] and $D_1$[CLK]), and a plurality of sets of select delay bits (SEL_DLY$_n$[5:0]). In the example of FIG. 1, the controller 105 may be circuitry configured to execute machine-readable instructions, such as a micro-controller unit (MCU), processor circuitry, central processing unit (CPU), etc. Alternatively, the controller 105 may be circuitry configured to perform operations described herein, such as a field programmable gate array (FPGA), a finite state machine (FSM), static random-access memory (SRAM), etc. The reference clock is a clock signal of a predefined frequency. The predefined frequency of the reference clock is approximately half of a frequency of data transmissions on the transmission lines 120. The controller 105 supplies the reference clock to the de-skew circuitry 115.

The plurality of data streams represent data to be transmitted to the SLM 110. The de-skew circuitry 115 serializes and delays the plurality of data streams. The de-skew circuitry 115 serializes two of the plurality of data streams (e.g., $D_0$[0] and $D_1$[0], $D_0$[n] and $D_1$[n]) to generate one relatively higher-speed data stream. Accordingly, the data rate of the plurality of data streams is approximately half of a data rate of the data transmitted on the transmission lines 120.

The clock data streams represent a clock signal to be transmitted to the SLM 110. Once delays of the de-skew circuitry 115 are configured, a first one of the clock data streams (e.g., $D_0$[CLK]) is set to a logic one (e.g., a reference voltage) and a second one of the clock data streams (e.g., $D_1$[CLK]) is set to a logic zero (e.g., a common potential). In such a configuration, the de-skew circuitry 115 serializes the clock data streams to generate a data streams which resembles a clock signal. Alternatively, another method of generating the clock signal may be used in accordance with the teachings disclosed herein.

The plurality of sets of select delay bits (SEL_DLY$_n$[5:0]) configure delays of the de-skew circuitry 115. The plurality of sets of select delay bits include a set of select delay bits (e.g., SEL_DLY$_0$[5:0] and SEL_DLY$_{CLK}$[5:0]) for each data stream generated by the de-skew circuitry 115. In the example of FIG. 1, each set of the select delay bits include six bits corresponding selection between sixty-four possible delays. Alternatively, the number of bits included in each set of select delay bits may differ based on a number of possible delays of the de-skew circuitry 115.

The controller 105 supplies the reference clock, the plurality of data streams, the clock data streams, and the plurality of sets of select delay bits to the de-skew circuitry 115. The controller 105 receives a test data reception indication (SLM_RX) from the SLM 110. The test data reception indication is a communication from the SLM 110 that test data has been received. In some examples, the test data reception indication includes a series bits configured to represent each data stream of the transmission lines 120. In such an example, the controller 105 may assert a bit of the test data reception indication to indicate transmission of the test data and the SLM 110 de-asserts the bit in response to determining a reception of the test data.

In another example, the test data reception indication is a series of communications between the controller 105 and the SLM 110. In such an example, the SLM 110 may indicate a number of bits of the test data that were received and/or a number of bits of the test data that were not received.

The SLM 110 is coupled to the controller 105 and the transmission lines 120. The SLM 110 receives a plurality of retimed data streams (DATA[n:0]) and a retimed clock (CLK) from the transmission lines 120. The SLM 110 samples the data streams based on the retimed clock. In such an example, the SLM 110 receives the retimed data streams and the retimed clock after the de-skew circuitry 115 delays each of the retimed data streams and the retimed clock.

The de-skew circuitry 115 is coupled between the controller 105 and the transmission lines 120. In the example of FIG. 1, the de-skew circuitry 115 includes first example retimer circuitry 125, a first example buffer 130, second example retimer circuitry 135, a second example buffer 140, third example retimer circuitry 145, a third buffer 150, and example DLL circuitry 155. The de-skew circuitry 115 receives the reference clock, the plurality of data streams, the clock data streams, and the plurality of sets of select delay bits from the controller 105. The de-skew circuitry 115 supplies the plurality of retimed data streams and the retimed clock to the SLM 110 using the transmission lines 120.

The first retimer circuitry 125 coupled to the controller 105, the first buffer 130, and the DLL circuitry 155. The first retimer circuitry 125 generates a first retimed data stream (DATA[0]) by serializing a first and second one of the plurality of data streams ($D_0[0]$ and $D_1[0]$) from the controller 105. The first retimer circuitry 125 generates the first retimed data stream by adding a first delay. The first delay corresponds to a timing difference between one of a plurality of delayed clocks (DLY[63:0]) from the DLL circuitry 155 and the reference clock from the controller 105. Selection of the first delay is based on a first set of the plurality of sets of select delay bits ($SEL\_DLY_0[5:0]$) from select delay bits of the controller 105. The first retimer circuitry 125 supplies the first retimed data stream to the first buffer 130. Examples of the first retimer circuitry 125 are illustrated in connection with FIGS. 2 and 3, below.

The first buffer 130 is coupled to the transmission lines 120 and the first retimer circuitry 125. The first buffer 130 receives the first retimed data stream from the first retimer circuitry 125. The first buffer 130 buffers the first retimed data stream. In some examples, the first buffer 130 amplifies the first retimed data stream. In such examples, the first buffer 130 increases a voltage domain of the first retimed data stream to a voltage domain capable of traversing the transmission lines 120. The first buffer 130 supplies the result of the buffering to the transmission lines 120. In some examples, the first buffer 130 may be referred to as a driver. The first buffer 130 is a single ended buffer. Alternatively, the de-skew circuitry 115 may be modified in accordance with the teachings disclosed herein for the first buffer 130 to be a differential buffer configured to supply a differential signal representative of the first retimed data stream to the SLM 110. Advantageously, the first buffer 130 increases a signal strength of the first retimed data stream prior to transmission to the SLM 110. Alternatively, other methods of increasing the signal strength of an output of the first retimer circuitry 125 may be used in accordance with teachings disclosed herein.

The second retimer circuitry 135 is coupled to the controller 105, the second buffer 140, and the DLL circuitry 155. The second retimer circuitry 135 generates a second retimed data stream (DATA[n]) by serializing a second and third ones of the plurality of data streams ($D_0[n]$ and $D_1[n]$) from the controller 105. The second retimer circuitry 135 generates the second retimed data stream by adding a second delay. The second delay is one of the delayed clocks from the DLL circuitry 155. Selection of the second delay is based on a second set of the plurality of sets of select delay bits from select delay terminals ($SEL\_DLY_n[5:0]$) of the controller 105. The second retimer circuitry 135 supplies the second retimed data stream to the second buffer 140. Advantageously, the second delay of the second retimer circuitry 135 is selected separately from the first delay of the first retimer circuitry 125. For example, a first set of select delay bits, coupled to the first retimer circuitry 125 adds a first delay, while a second set of select delay bits, coupled to the second retimer circuitry 135 may add a second delay.

The second buffer 140 is coupled to the transmission lines 120 and the second retimer circuitry 135. The second buffer 140 receives the second retimed data stream from the second retimer circuitry 135. The second buffer 140 buffers the second retimed data stream. In some examples, the second buffer 140 amplifies the second retimed data stream. In such examples, the second buffer 140 increases a voltage domain of the second retimed data stream to a voltage domain capable of traversing the transmission lines 120. The second buffer 140 supplies the result of the buffering to the transmission lines 120. In some examples, the second buffer 140 may be referred to as a driver. The second buffer 140 is a single ended buffer. Alternatively, the de-skew circuitry 115 may be modified in accordance with the teachings disclosed herein for the second buffer 140 to be a differential buffer configured to supply a differential signal representative of the second retimed data stream to the SLM 110. Advantageously, the second buffer 140 increases a signal strength of the second retimed data stream prior to transmission to the SLM 110. Alternatively, other methods of increasing the signal strength of the output of the second retimer circuitry 135 may be used in accordance with teachings disclosed herein.

The third retimer circuitry 145 is coupled to the controller 105, the third buffer 150, and the DLL circuitry 155. The third retimer circuitry 145 generates the retimed clock (DATA[CLK]) by serializing the plurality of clock data streams from the controller 105. The third retimer circuitry 145 generates the retimed clock. The third delay is one of the delayed clocks from the DLL circuitry 155. Selection of the third delay is based on a third set of the plurality of sets of select delay bits ($SEL\_DLY_{CLK}[5:0]$) from the controller 105. The third retimer circuitry 145 supplies the third retimed data stream to the second buffer 140. Advantageously, the third delay of the third retimer circuitry 145 is selected separately from the first and second delays of the retimer circuitry 125 and 135.

The third buffer 150 is coupled to the transmission lines 120 and the third retimer circuitry 145. The third buffer 150 receives the third retimed data stream from the third retimer circuitry 145. The third buffer 150 buffers the third retimed data stream. In some examples, the third buffer 150 amplifies the third retimed data stream. In such examples, the third buffer 150 increases a voltage domain of the third retimed data stream to a voltage domain capable of traversing the transmission lines 120. The third buffer 150 supplies the result of the buffering to the transmission lines 120. In some examples, the third buffer 150 may be referred to as a driver. The third buffer 150 is a single ended buffer. Alternatively, the de-skew circuitry 115 may be modified in accordance with the teachings disclosed herein for the third buffer 150 to be a differential buffer configured to supply a differential signal representative of the third retimed data stream to the SLM 110. Advantageously, the third buffer 150 increases a signal strength of the third retimed data stream prior to transmission to the SLM 110. Alternatively, other methods of increasing the signal strength of the output of the third retimer circuitry 145 may be used in accordance with teachings disclosed herein.

In the example of FIG. 1, the de-skew circuitry 115 includes retimer circuitry 125, 135, and 145. Alternatively, the de-skew circuitry 115 may include any plurality of instances of the retimer circuitry 125, 135, and/or 145, in accordance with the teachings disclosed herein. In some examples, the de-skew circuitry 115 may include four or more instances of the retimer circuitry 125, 135, and/or 145.

The DLL circuitry 155 is coupled to the controller 105 and the retimer circuitry 125, 135, and 145. The DLL circuitry 155 generates the delayed clocks based on the reference clock from the controller 105. The DLL circuitry 155 supplies the delayed clocks to the retimer circuitry 125, 135, and 145. An example of the DLL circuitry 155 is illustrated and discussed in connection with FIG. 4, below.

Figure 2:
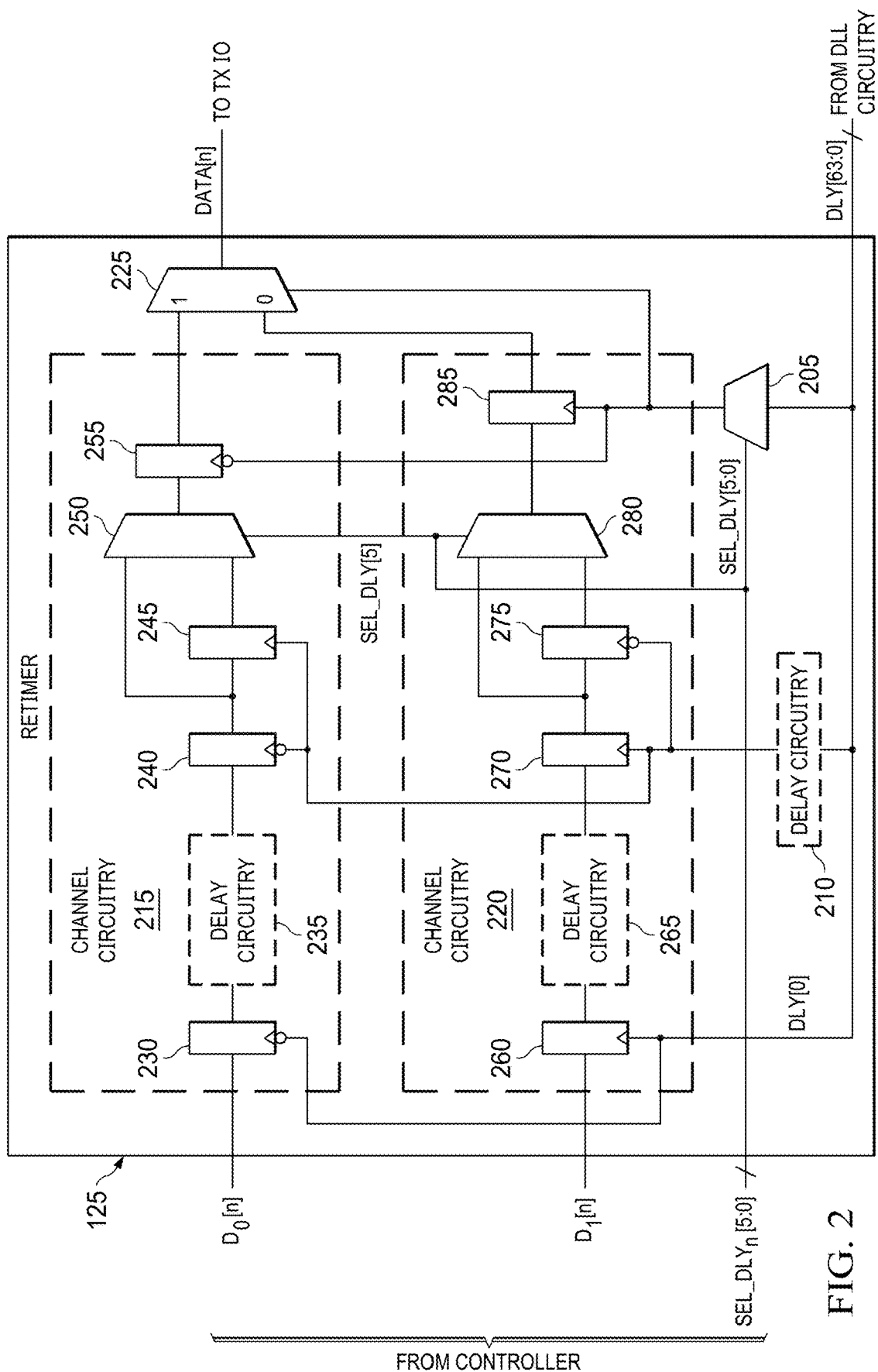
FIG. 2 is a schematic diagram of a first example of the retimer circuitry of FIG. 1.

FIG. 2 is a schematic diagram of an example of the retimer circuitries 125, 135, and/or 145 of FIG. 1. In the example of FIG. 2, the first retimer circuitry 125 includes a first example multiplexer 205, first delay circuitry 210, first example channel circuitry 215, a second example channel circuitry 220, and a second multiplexer 225. The first retimer circuitry 125 generates a retimed data stream (DATA[n]) by serializing and delaying a first data stream ($D_0[n]$) and a second data stream ($D_1[n]$) from the controller 105. The first retimer circuitry 125 configures the first multiplexer 205 to select one of the delayed clocks (DLY[63:0]) based on select delay bits ($SEL\_DLY_n[5:0]$) from the controller 105 of FIG. 1.

The first multiplexer 205 is coupled to the controller 105 of FIG. 1, the DLL circuitry 155 of FIG. 1, the channel circuitry 215 and 220, and the second multiplexer 225. The first multiplexer 205 determines which of the delayed clocks from the DLL circuitry 155 the first retimer circuitry 125 uses to generate the retimed data stream. The select delay bits control the first multiplexer 205. The first multiplexer 205 supplies the selected delayed clock to the channel circuitry 215 and 220 and the second multiplexer 225.

The first delay circuitry 210 is coupled to one of the delayed clocks from the DLL circuitry 155. The first delay circuitry 210 is configured to add a propagation delay approximately equal to a propagation delay added by the first multiplexer 205 to the one of the delayed clocks. For example, the first delay circuitry 210 may be a multiplexer that approximates the propagation delay of the first multiplexer 205. In such an example, the multiplexer of the first delay circuitry 210 may be set to one of the plurality of delayed clocks. The first delay circuitry 210 supplies the one of the delayed clock signals to the channel circuitry 215 and 220.

In the example of FIG. 2, the first channel circuitry 215 includes a first example flip-flop 230, second example delay circuitry 235, a second example flip-flop 240, a third example flip-flop 245, a third example multiplexer 250, and a fourth example flip-flop 255. The first channel circuitry 215 is coupled to the multiplexer 225. The first channel circuitry 215 receives the first data stream from the controller 105 by a first data terminal. The first channel circuitry 215 delays the first data stream based on the delayed clock signal from the first multiplexer 205. The first channel circuitry 215 supplies the delayed first data stream to the second multiplexer 225.

The first flip-flop 230 includes a first data terminal, a second data terminal, and a first clock terminal. The first data terminal is coupled to the controller 105. The second data terminal is coupled to the second delay circuitry 235. The first clock terminal is coupled to the DLL circuitry 155. The first flip-flop 230 receives the first data stream from the controller 105. The first flip-flop 230 receives a first delayed clock (DLY[0]) from the DLL circuitry 155. The first flip-flop 230 latches the first data stream based on an inverse of the first delayed clock. For example, the first flip-flop 230 latches the first data stream on a falling edge of the first delayed clock. In such an example, the falling edge of the first delayed clock is a rising edge of the inverse first delayed clock. The first flip-flop 230 supplies the latched data of the first data stream to the second delay circuitry 235. In the example of FIG. 1, the first flip-flop 230 is a D-flip-flop. Alternatively, the first retimer circuitry 125 may be modified such that the first flip-flop 230 may be a set-reset (SR) latch, a JK flip-flop, a toggle (T) flip-flop, etc.

The second delay circuitry 235 is coupled between the flip-flops 230 and 240. The second delay circuitry 235 receives latched data of the first data stream by the second data terminal of the first flip-flop 230. The second delay circuitry 235 is configured to add a propagation delay to the latched data of the first data stream. The propagation delay of the second delay circuitry 235 is approximately equal to the propagation delays of the first multiplexer 205 and the first delay circuitry 210. For example, the second delay circuitry 235 may be a multiplexer to approximate the propagation delay of the first multiplexer 205. The second delay circuitry 235 supplies the latched data of the first data stream to the second flip-flop 240. Advantageously, the propagation delay of the second delay circuitry 235 accounts for the propagation delay of the first multiplexer 205 and the first delay circuitry 210.

The second flip-flop 240 includes a third data terminal, a fourth data terminal, and a second clock terminal. The third data terminal is coupled to the second delay circuitry 235. The fourth data terminal is coupled to the third flip-flop 245 and the third multiplexer 250. The second clock terminal is coupled to the first delay circuitry 210. The second flip-flop 240 receives the latched data of the first data stream from the second delay circuitry 235. The second flip-flop 240 latches the latched first data stream from the second delay circuitry 235 based on an inverse of the delayed clock signal from the first delay circuitry 210. For example, the second flip-flop 240 latches on a falling edge of the delayed clock signal from the first delay circuitry 210. In such an example, the falling edge of the delayed clock signal is a rising edge of the inverse of the delayed clock signal. The second flip-flop 240 supplies latched data of the first data stream to the third flip-flop 245 and the third multiplexer 250. In the example of FIG. 1, the second flip-flop 240 is a D-flip-flop. Alternatively, the first retimer circuitry 125 may be modified such that the second flip-flop 240 may be an SR latch, a JK flip-flop, a T flip-flop, etc.

The third flip-flop 245 includes a fifth data terminal, a sixth data terminal, and a third clock terminal. The fifth data terminal is coupled to the second flip-flop 240. The sixth data terminal is coupled to the third multiplexer 250. The third clock terminal is coupled to the first delay circuitry 210. The third flip-flop 245 latches the latched data of the first data stream from the second flip-flop 240 based on the delayed clock signal from the first delay circuitry 210. For example, the third flip-flop 245 latches on a rising edge of the delayed clock signal from the first delay circuitry 210. The third flip-flop 245 supplies latched data of the first data stream to the third multiplexer 250. In the example of FIG. 1, the third flip-flop 245 is a D-flip-flop. Alternatively, the first retimer circuitry 125 may be modified such that the third flip-flop 245 may be an SR latch, a JK flip-flop, a T flip-flop, etc.

The third multiplexer 250 include a first multiplexer terminal, a second multiplexer terminal, a third multiplexer terminal, and a control terminal. The first multiplexer terminal is coupled to the second flip-flop 240. The second multiplexer terminal is coupled to the third flip-flop 245. The third multiplexer terminal is coupled to the fourth flip-flop 255. The control terminal is coupled to the controller 105. The third multiplexer 250 supplies latched data from one of the flip-flops 240 or 245 to the second multiplexer 225 based on a most significant bit (MSB) of the select delay bits from the controller 105. For example, the third multiplexer 250 supplies the latched data from the second flip-flop 240 when the delayed clock signal, selected by the select delay bits, is approximately less than half of a clock cycle of the reference clock. In such an example, an MSB of the select delay bits being a logic zero indicates that the configurable delay of the first retimer circuitry 125 is less than half of a cycle of the reference clock. In another example, the third multiplexer 250 supplies the latched data from the third flip-flop 245 when the delayed clock, selected by the select delay bits, is delayed by an amount approximately greater than or equal to half of a clock cycle of the reference clock. In such an example, an MSB of the select delay bits being a logic one indicates that the configurable delay of the first retimer circuitry 125 is greater than or equal to half of a cycle of the reference clock. Advantageously, the third multiplexer 250 allows the first retimer circuitry 125 to include configurable delays greater than or equal to half of a cycle of the reference clock.

The fourth flip-flop 255 includes a seventh data terminal, an eighth data terminal, and a fourth clock terminal. The seventh data terminal is coupled to the third multiplexer 250. The eighth data terminal is coupled to the second multiplexer 225. The fourth clock terminal is coupled to the first multiplexer 205. The fourth flip-flop 255 latches data from the third multiplexer 250 based on an inverse of the delayed clock from the first multiplexer 205. For example, the fourth flip-flop 255 latches on a falling edge of the delayed clock from the first multiplexer 205. The fourth flip-flop 255 supplies the latched data to the second multiplexer 225. In the example of FIG. 2, the fourth flip-flop 255 is a D-flip-flop. Alternatively, the first retimer circuitry 125 may be modified such that the fourth flip-flop 255 may be an SR latch, a JK flip-flop, a T flip-flop, etc.

In the example of FIG. 2, the second channel circuitry 220 includes a fifth example flip-flop 260, third example delay circuitry 265, a sixth example flip-flop 270, a seventh example flip-flop 275, a fourth example multiplexer 280, and an eighth example flip-flop 285. The second channel circuitry 220 is coupled to the multiplexer 225. The second channel circuitry 220 receives the second data stream from the controller 105. The second channel circuitry 220 delays the second data stream based on the selected delay from the first multiplexer 205. The second channel circuitry 220 supplies the delayed second data stream to the second multiplexer 225.

The fifth flip-flop 260 is coupled to the controller 105 and the third delay circuitry 265. The fifth flip-flop 260 latches data of the second data stream based on the first delayed clock from the DLL circuitry 155. The fifth flip-flop 260 supplies the latched data to the third delay circuitry 265. In the example of FIG. 1, the fifth flip-flop 260 is a D-flip-flop. Alternatively, the first retimer circuitry 125 may be modified such that the fifth flip-flop 260 may be an SR latch, a JK flip-flop, a T flip-flop, etc.

The third delay circuitry 265 is coupled between the flip-flops 260 and 270. The third delay circuitry 265 is configured to add a propagation delay approximately equal to the propagation delay added by the first multiplexer 205 and the delay circuitry 210 and 235. The third delay circuitry 265 supplies the delayed latched data to the sixth flip-flop 270. Advantageously, the propagation delay of the third delay circuitry 265 accounts for the propagation delay of the first multiplexer 205 and the first delay circuitry 210.

The sixth flip-flop 270 is coupled to the delay circuitry 210 and 265, the seventh flip-flop 275, and the fourth multiplexer 280. The sixth flip-flop 270 latches data from the third delay circuitry 265 based on the delayed clock from the first delay circuitry 210. The sixth flip-flop 270 supplies the latched data to the seventh flip-flop 275 and the fourth multiplexer 280. In the example of FIG. 2, the sixth flip-flop 270 is a D-flip-flop. Alternatively, the sixth flip-flop 270 may be an SR latch, a JK flip-flop, a T flip-flop, etc.

The seventh flip-flop 275 is coupled to the first delay circuitry 210, the sixth flip-flop 270, and the fourth multiplexer 280. The seventh flip-flop 275 latches data from the sixth flip-flop 270 based on an inverse of the delayed clock from the first delay circuitry 210. The seventh flip-flop 275 supplies the latched data to the fourth multiplexer 280. In the example of FIG. 1, the seventh flip-flop 275 is a D-flip-flop. Alternatively, the first retimer circuitry 125 may be modified such that the seventh flip-flop 275 may be an SR latch, a JK flip-flop, a T flip-flop, etc.

The fourth multiplexer 280 is coupled to the controller 105 and the flip-flops 270, 275, and 285. The fourth multiplexer 280 supplies latched data from one of the flip-flops 270 or 275 to the second multiplexer 225 based on the MSB of the select delay bits from the controller 105. Advantageously, the fourth multiplexer 280 allows the first retimer circuitry 125 to include configurable delays greater than or equal to half of a cycle of the reference clock.

The eighth flip-flop 285 is coupled to the multiplexers 205, 225, and 280. The eighth flip-flop 285 latches data from the fourth multiplexer 280 based on the delayed clock from the first multiplexer 205. The eighth flip-flop 285 supplies the latched data to the second multiplexer 225. In the example of FIG. 2, the eighth flip-flop 285 is a D-flip-flop. Alternatively, the first retimer circuitry 125 may be an SR latch, a JK flip-flop, a T flip-flop, etc.

The second multiplexer 225 is coupled to the first multiplexer 205 and the channel circuitry 215 and 220. The second multiplexer 225 generates a retimed data stream by coupling one of the latched data streams from the channel circuitry 215 or 220 to the first buffer 130 of FIG. 1 based on the delayed clock from the first multiplexer 205. For example, the second multiplexer 225 supplies data from the first channel circuitry 215 when the selected delayed clock from the first multiplexer 205 is a logic one. In such an example, the second multiplexer 225 supplies data from the second channel circuitry 220 when the selected delayed clock from the first multiplexer 205 is a logic zero. Advantageously, the second multiplexer 225 serializes data from the channel circuitry 215 and 220. Advantageously, the second multiplexer 225 increases a speed of the data from the channel circuitry 215 and 220.

Figure 3:
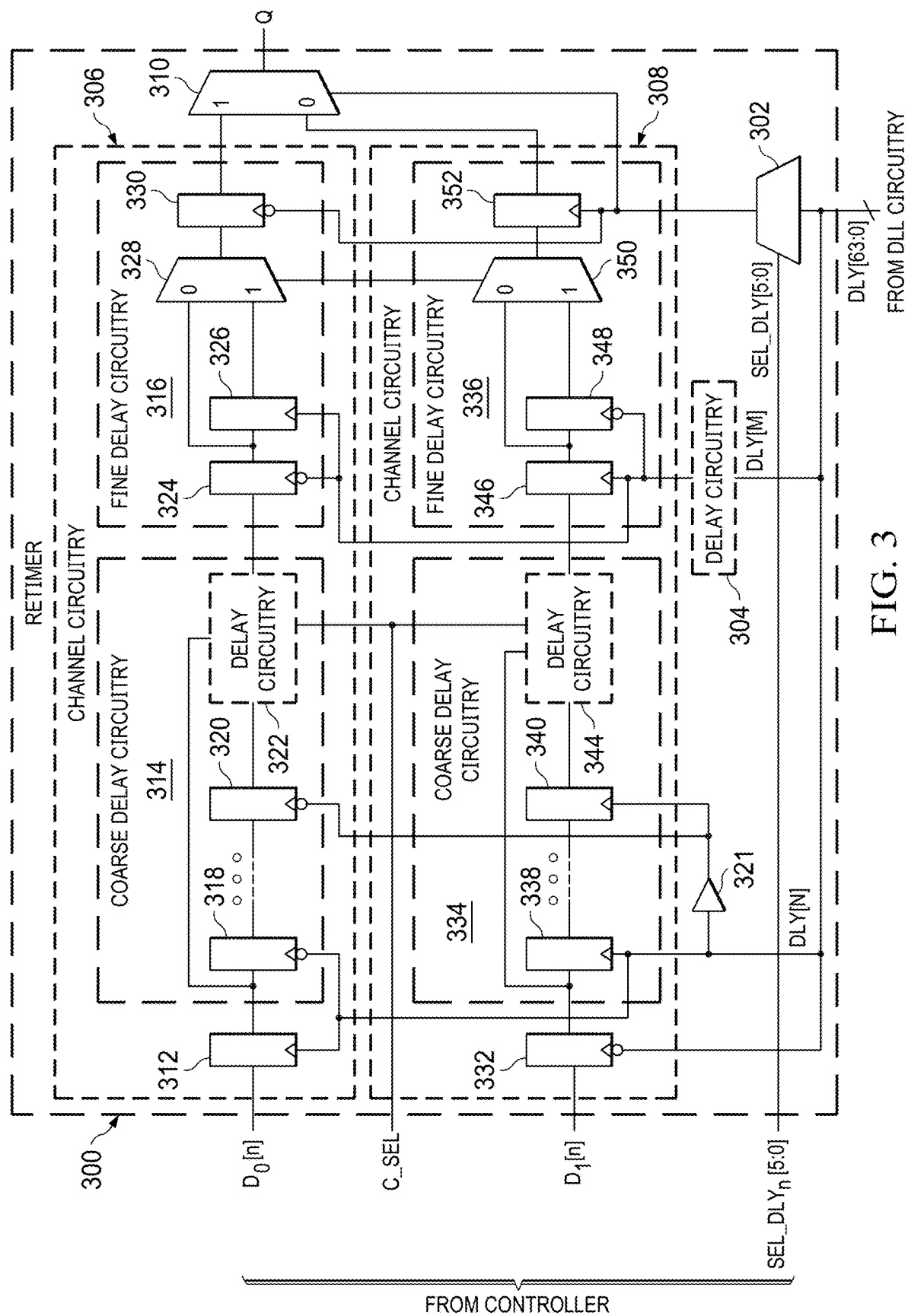
FIG. 3 is a schematic diagram of a second example of the retimer circuitry of FIG. 1 including coarse delay generation circuitry and fine delay generation circuitry.

FIG. 3 is a schematic diagram of an example retimer circuitry 300. The retimer circuitry 300 is an example of the retimer circuitry 125, 135, and 145 of FIGS. 1 and 2. In the example of FIG. 3, the retimer circuitry 300 includes a first example multiplexer 302, first example delay circuitry 304, first example channel circuitry 306, second example channel circuitry 308, and a second example multiplexer 310. The retimer circuitry 300 is an alternate example of the retimer circuitry 125, 135, and 145 of FIGS. 1 and 2. The retimer circuitry 300 includes circuitry in the channel circuitry 306 and 308 capable of adding a programmable delay greater than one cycle of the reference clock (CLK_REF) from the controller 105. For example, the controller 105 of FIG. 1 may set a course select value (C_SEL) to delay the data streams ($D_0[n]$ and $D_1[n]$) by more than a cycle of the reference clock.

The first multiplexer 302 is coupled to the controller 105, the DLL circuitry 155 of FIG. 1, the channel circuitry 306 and 308, and the second multiplexer 310. The first multiplexer 302 supplies one of the delayed clocks from the DLL circuitry 155 to the channel circuitry 306 and 308 and the second multiplexer 310 based on the select delay bits from the controller 105.

The first delay circuitry 304 is coupled to the controller 105, the DLL circuitry 155, and the channel circuitry 306 and 308. The first delay circuitry 304 includes circuitry to delay a first delayed clock (DLY[M]) by an amount equal to a propagation delay added by the first multiplexer 302. For example, the first delay circuitry 304 may be a multiplexer that is approximately equivalent to the first multiplexer 302. In such an example, the multiplexer of the first delay circuitry 304 may be configured to add the propagation delay to a delayed clock that optimizes timing margins of the channel circuitry 306 and 308. The timing margins of the channel circuitry 306 and 308 are discussed further in FIG. 5, below. The first delay circuitry 304 supplies the first delayed clock signal to the channel circuitry 306 and 308.

The first channel circuitry 306 is configured to be coupled to the controller 105, the first multiplexer 302, the first delay circuitry 304, and the second multiplexer 310. In the example of FIG. 3, the first channel circuitry 306 includes a first example flip-flop 312, first example coarse delay circuitry 314, and first example fine delay circuitry 316. The first channel circuitry 306 receives the first data stream from the controller 105. The first channel circuitry 306 delays the first data stream based on the selected delayed clock from the first multiplexer 302. The first channel circuitry 306 supplies the delayed first data stream to the second multiplexer 310.

The first flip-flop 312 is coupled to the controller 105, the DLL circuitry 155, and the first coarse delay circuitry 314. The first flip-flop 312 latches data of the first data stream from the controller 105 based on a second delayed clock (DLY[N]) from the DLL circuitry 155. The second delayed clock signal may be selected from the plurality of delayed clocks from the DLL circuitry 155 to optimize timing margins of the retimer circuitry 300. Such a selection is described in connection with FIG. 5, below. The first flip-flop 312 supplies latched data to the first coarse delay circuitry 314. In the example of FIG. 3, the first flip-flop 312 is a D-flip-flop. Alternatively, the retimer circuitry 300 may be modified such that the first flip-flop 312 may be an SR latch, a JK flip-flop, a T flip-flop, etc.

The first coarse delay circuitry 314 is coupled to the controller 105, the DLL circuitry 155, the first flip-flop 312, and the first fine delay circuitry 316. In the example of FIG. 3, the first coarse delay circuitry 314 includes a second example flip-flop 318, a third example flip-flop 320, and second example delay circuitry 322. The first coarse delay circuitry 314 may delay data from the first flip-flop 312 by a cycle of the reference clock from the controller 105 based on a state of the coarse select from the controller 105. For example, the first coarse delay circuitry 314 delays data from the first flip-flop 312 by a cycle of the reference clock when the coarse select is set to a logic one.

The second flip-flop 318 is coupled to the DLL circuitry 155, the first flip-flop 312, and the third flip-flop 320. In some examples, the first channel circuitry 306 includes a plurality of flip-flops coupled in series between the flip-flops 318 and 320. The second flip-flop 318 latches data from the first flip-flop 312 based on an inverse of the second delayed clock from the DLL circuitry 155. The second flip-flop 318 supplies latched data to the third flip-flop 320. In the example of FIG. 3, the second flip-flop 318 is a D-flip-flop. Alternatively, the retimer circuitry 300 may be modified such that the second flip-flop 318 may be an SR latch, a JK flip-flop, a T flip-flop, etc.

The third flip-flop 320 is coupled to the second flip-flop 318, an example buffer 321, and the second delay circuitry 322. The third flip-flop 320 latches data from the second flip-flop 318 based on an inverse of the second delayed clock from the buffer 321. The third flip-flop 320 supplies latched data to the second delay circuitry 322. In the example of FIG. 3, the third flip-flop 320 is a D-flip-flop. Alternatively, the retimer circuitry 300 may be modified such that the third flip-flop 320 may be an SR latch, a JK flip-flop, a T flip-flop, etc.

The buffer 321 is coupled to the DLL circuitry 155 and the channel circuitry 306 and 308. The buffer 321 adds a propagation delay to the second delayed clock from the DLL circuitry 155. The buffer 321 supplies a further delayed clock signal to the channel circuitry 306 and 308. Advantageously, the third flip-flop 320 latches data after the second flip-flop 318 latches data in response to the further delayed clock signal. Advantageously, the propagation delay of the buffer 321 sets a delay between the flip-flops 318 and 320 latching data.

The second delay circuitry 322 is coupled to the controller 105, the flip-flops 312 and 320, and the first fine delay circuitry 316. The second delay circuitry 322 delays latched data by an amount approximately equal to the propagation delay added by the first multiplexer 302. The coarse select from the controller 105 determines which of the flip-flops 312 or 320 latched data is delayed. For example, the controller 105 causes the second delay circuitry 322 to delay the latched data from the first flip-flop 312 when the coarse select is set to a logic one. In such an example, the controller 105 causes the second delay circuitry 322 to delay the latched data from the third flip-flop 320 when the coarse select is set to a logic zero. Alternatively, the coarse select may be a plurality of bits configured to select between a plurality of possible delays. The second delay circuitry 322 supplies the delayed latched data to the first fine delay circuitry 316. Advantageously, the delay of the second delay circuitry 322 accounts for the propagation delay of the first multiplexer 302.

The first fine delay 316 is coupled to the first multiplexer 302, the first delay circuitry 304, the second multiplexer 310, and the first coarse delay circuitry 314. In the example of FIG. 3, the first fine delay circuitry 316 includes a fourth example flip-flop 324, a fifth example flip-flop 326, a third example multiplexer 328, and a sixth example flip-flop 330. The first fine delay circuitry 316 delays latched data from the first coarse delay circuitry 314 by less than a cycle of the reference clock from the controller 105.

The fourth flip-flop 324 is coupled to the first delay circuitry 304, the first coarse delay circuitry 314, the fifth flip-flop 326, and the third multiplexer 328. The fourth flip-flop 324 latches data from the first coarse delay circuitry 314 based on an inverse of the first delayed clock signal from the first delay circuitry 304. The fourth flip-flop 324 supplies latched data to the fifth flip-flop 326 and the third multiplexer 328. In the example of FIG. 3, the fourth flip-flop 324 is a D-flip-flop. Alternatively, the retimer circuitry 300 may be modified such that the fourth flip-flop 324 may be an SR latch, a JK flip-flop, a T flip-flop, etc.

The fifth flip-flop 326 is coupled to the first delay circuitry 304, the fourth flip-flop 324, and the third multiplexer 328. The fifth flip-flop 326 latches data from the fourth flip-flop 324 based on the first delayed clock from the first delay circuitry 304. The fifth flip-flop 326 supplies latched data to the third multiplexer 328. In the example of FIG. 3, the fifth flip-flop 326 is a D-flip-flop. Alternatively, the retimer circuitry 300 may be modified such that the fifth flip-flop 326 may be an SR latch, a JK flip-flop, a T flip-flop, etc.

The third multiplexer 328 is coupled to the flip-flops 324, 326, and 330. The third multiplexer 328 supplies latched data from one of the flip-flops 324 or 326 to the sixth flip-flop 330 based on an MSB of the select delay bits from the controller 105. Advantageously, the third multiplexer 328 allows the retimer circuitry 300 to include configurable delays greater than or equal to half of a cycle of the reference clock.

The sixth flip-flop 330 is coupled to the multiplexers 302, 310, and 328. The sixth flip-flop 330 latches data from the third multiplexer 328 based on an inverse of the delayed clock from the first multiplexer 302. The sixth flip-flop 330 supplies the latched data to the second multiplexer 310. In the example of FIG. 3, the sixth flip-flop 330 is a D-flip-flop. Alternatively, the retimer circuitry 300 may be modified such that the sixth flip-flop 330 may be an SR latch, a JK flip-flop, a T flip-flop, etc.

Figure 4:
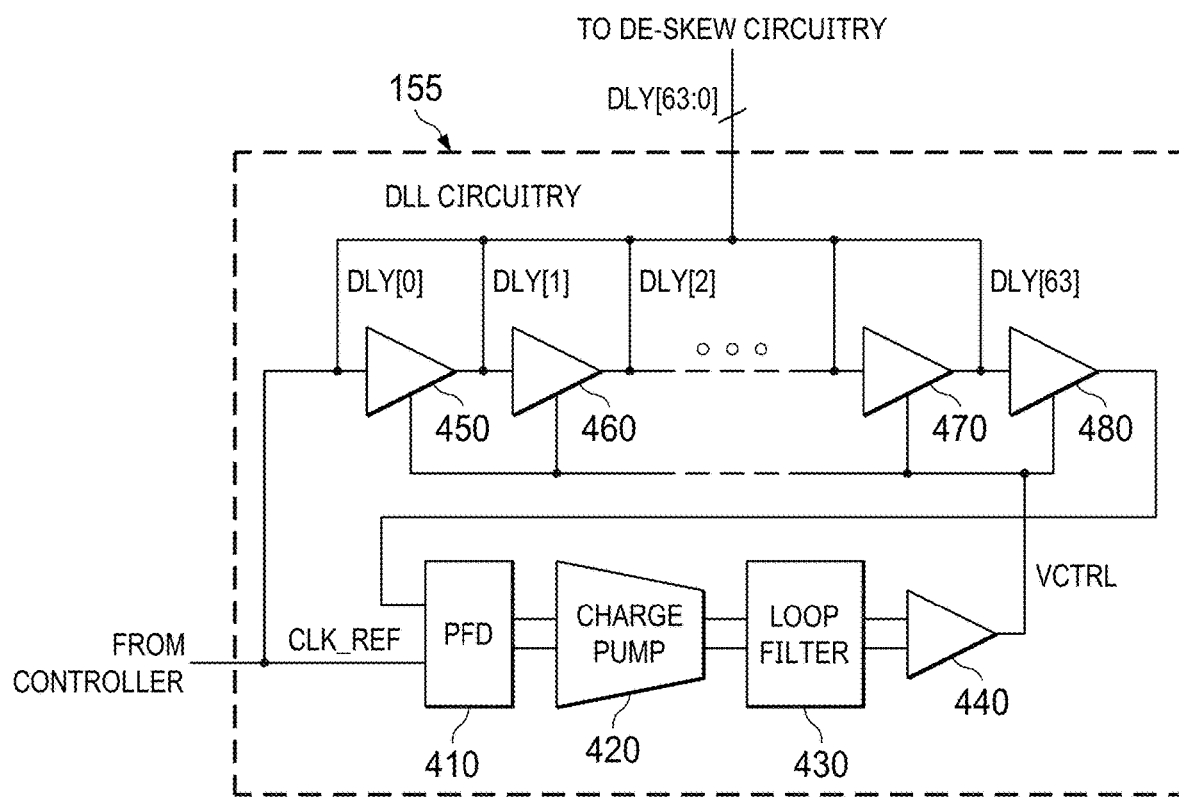
FIG. 4 is a schematic diagram of an example of the delay locked loop circuitry of FIG. 1.

The second channel circuitry 308 is configured to be coupled to the controller 105, the first multiplexer 302, the first delay circuitry 304, and the second multiplexer 310. In the example of FIG. 4, the second channel circuitry 308 includes a seventh example flip-flop 332, second example coarse delay circuitry 334, and second example fine delay circuitry 336. The second channel circuitry 308 receives the second data stream from the controller 105. The second channel circuitry 308 delays the second data stream based on the selected delayed clock from the first multiplexer 302. The second channel circuitry 308 supplies the delayed second data stream to the second multiplexer 310.

The seventh flip-flop 332 is coupled to the controller 105, the DLL circuitry 155, and the second coarse delay circuitry 334. The seventh flip-flop 332 latches data of the second data stream from the controller 105 based on an inverse of the second delayed clock from the DLL circuitry 155. The seventh flip-flop 332 supplies latched data to the second coarse delay circuitry 334. In the example of FIG. 3, the seventh flip-flop 332 is a D-flip-flop. Alternatively, the retimer circuitry 300 may be modified such that the seventh flip-flop 332 may be an SR latch, a JK flip-flop, a T flip-flop, etc.

The second coarse delay circuitry 334 is coupled to the controller 105, the DLL circuitry 155, the seventh flip-flop 332, and the second fine delay circuitry 336. In the example of FIG. 3, the second coarse delay circuitry 334 includes an eighth example flip-flop 338, a ninth example flip-flop 340, and third example delay circuitry 344. The second coarse delay circuitry 334 may delay data from the seventh flip-flop 332 by a cycle of the reference clock from the controller 105 based on a state of the coarse select from the controller 105. For example, the second coarse delay circuitry 334 delays data from the seventh flip-flop 332 by a cycle of the reference clock when the coarse select is set to a logic one.

The eighth flip-flop 338 is coupled to the DLL circuitry 155, the seventh flip-flop 332, and the ninth flip-flop 340. In some examples, the second channel circuitry 306 includes a plurality of flip-flops coupled in series between the flip-flops 338 and 340. The eighth flip-flop 338 latches data from the seventh flip-flop 332 based on the second delayed clock from the DLL circuitry 155. The eighth flip-flop 338 supplies latched data to the ninth flip-flop 340. In the example of FIG. 3, the eighth flip-flop 338 is a D-flip-flop. Alternatively, the retimer circuitry 300 may be modified such that the eighth flip-flop 338 may be an SR latch, a JK flip-flop, a T flip-flop, etc.

The ninth flip-flop 340 is coupled to the eighth flip-flop 338, the buffer 321, and the third delay circuitry 344. The ninth flip-flop 340 latches data from the eighth flip-flop 338 based on the second delayed clock signal from the buffer 321. The ninth flip-flop 340 supplies latched data to the third delay circuitry 344. In the example of FIG. 3, the ninth flip-flop 340 is a D-flip-flop. Alternatively, the retimer circuitry 300 may be modified such that the ninth flip-flop 340 may be an SR latch, a JK flip-flop, a T flip-flop, etc.

The third delay circuitry 344 is coupled to the controller 105, the flip-flops 332 and 340, and the second fine delay circuitry 336. The third delay circuitry 344 delays latched data by a time approximately equal to the propagation delay added by the first multiplexer 302. The coarse select from the controller 105 determines which of the flip-flops 332 or 340 latched data is delayed. The third delay circuitry 344 supplies the delayed latched data to the second fine delay circuitry 336. Advantageously, the delay of the third delay circuitry 344 accounts for the propagation delay of the first multiplexer 302.

The second fine delay circuitry 336 is coupled to the first multiplexer 302, the first delay circuitry 304, the second multiplexer 310, and the second coarse delay circuitry 334. In the example of FIG. 3, the second fine delay circuitry 336 includes a tenth example flip-flop 346, an eleventh example flip-flop 348, a fourth example multiplexer 350, and a twelfth example flip-flop 352. The second fine delay circuitry 336 delays latched data from the second coarse delay circuitry 334 by less than a cycle of the reference clock from the controller 105.

The tenth flip-flop 346 is coupled to the first delay circuitry 304, the eleventh flip-flop 348, the second coarse delay circuit 334, and the fourth multiplexer 350. The tenth flip-flop 346 latches data from the second coarse delay circuitry 334 based on the first delayed clock from the first delay circuitry 304. The tenth flip-flop 346 supplies latched data to the eleventh flip-flop 348 and the fourth multiplexer 350. In the example of FIG. 3, the tenth flip-flop 346 is a D-flip-flop. Alternatively, the retimer circuitry 300 may be modified such that the tenth flip-flop 346 may be an SR latch, a JK flip-flop, a T flip-flop, etc.

The eleventh flip-flop 348 is coupled to the first delay circuitry 304, the tenth flip-flop 346, and the fourth multiplexer 350. The eleventh flip-flop 348 latches data from the tenth flip-flop 346 based on an inverse of the first delayed clock from the first delay circuitry 304. The eleventh flip-flop 348 supplies latched data to the fourth multiplexer 350. In the example of FIG. 3, the eleventh flip-flop 348 is a D-flip-flop. Alternatively, the retimer circuitry 300 may be modified such that the eleventh flip-flop 348 may be an SR latch, a JK flip-flop, a T flip-flop, etc.

The fourth multiplexer 350 is coupled to the flip-flops 346, 348, and 352. The fourth multiplexer 350 supplies latched data from one of the flip-flops 346 or 348 to the twelfth flip-flop 352 based on the MSB of the select delay bits from the controller 105. Advantageously, the fourth multiplexer 350 allows the retimer circuitry 300 to include configurable delays greater than or equal to half of a cycle of the reference clock.

The twelfth flip-flop 352 is coupled to the multiplexers 302, 310, and 350. The twelfth flip-flop 352 latches data from the fourth multiplexer 350 based on the delayed clock from the first multiplexer 302. The twelfth flip-flop 352 supplies the latched data to the second multiplexer 310. In the example of FIG. 3, the twelfth flip-flop 352 is a D-flip-flop. Alternatively, the retimer circuitry 300 may be modified such that the twelfth flip-flop 352 may be an SR latch, a JK flip-flop, a T flip-flop, etc.

The second multiplexer 310 is coupled to the first multiplexer 302 and the channel circuitry 306 and 308. The second multiplexer 310 supplies one of the latched data streams from the channel circuitry 306 or 308 to the first buffer 130 of FIG. 1 based on the delayed clock from the first multiplexer 302. For example, the second multiplexer 310 supplies data from the first channel circuitry 306 when the selected delayed clock from the first multiplexer 302 is a logic one. In such an example, the second multiplexer 310 supplies data from the second channel circuitry 308 when the selected delayed clock from the first multiplexer 302 is a logic zero. Advantageously, the second multiplexer 310 serializes data from the channel circuitry 306 and 308. Advantageously, the second multiplexer 310 increases a speed of the data from the channel circuitry 306 and 308.

FIG. 4 is a schematic diagram of an example of the DLL circuitry 155 of FIG. 1. In the example of FIG. 4, the DLL circuitry 155 includes an example phase-frequency detector (PFD) 410, an example charge pump 420, an example loop filter 430, an example amplifier 440, a first example buffer 450, a second example buffer 460, a third example buffer 470, and a fourth example buffer 480. The DLL circuitry 155 generates a plurality of delayed clocks (DLY[63:0]) based on a reference clock (CLK_REF) from the controller 105 of FIG. 1. In the example of FIG. 4, the DLL circuitry 155 generates sixty-four delayed clocks. Alternatively, the DLL circuitry 155 may generate any number of delayed clocks in accordance with the teachings disclosed herein.

The PFD 410 is coupled to the controller 105, the charge pump 420, and the fourth buffer 480. The PFD 410 compares phases of the reference clock from the controller 105 to a delayed clock from the fourth buffer 480. Such a comparison may be referred to as phase detection. The PFD 410 generates a voltage pulse based on the comparison of the phases of the reference clock and the delayed clock. For example, the PFD 410 generates a first voltage pulse of a first duration in response to a first phase difference and a second voltage pulse of a second duration in response to a second phase difference. In such an example, the PFD 410 does not generate a voltage pulse to the charge pump 420 in response to a determination that the delayed clock and the reference clock are approximately in phase. The PFD 410 supplies the voltage pulse to the charge pump 420. Alternatively, the DLL circuitry 155 may be modified to include an alternate method of phase detection, such as an XOR phase detector.

The charge pump 420 is coupled to the PFD 410 and the loop filter 430. The charge pump 420 receives the voltage pulse from the PFD 410. The charge pump 420 generates a control current based on the voltage pulse from the PFD 410. The charge pump 420 modifies a magnitude of the control current based on subsequent voltage pulses from the PFD 410. For example, a voltage pulse from the PFD 410 causes the charge pump 420 to modify a control current representative of the voltage pulse. The charge pump 420 supplies the control current to the loop filter 430. Advantageously, the control current from the charge pump 420 supplies power to the loop filter 430 while the PFD 410 does not detect a phase difference.

The loop filter 430 is coupled to the charge pump 420 and the amplifier 440. The loop filter 430 receives the control current from the charge pump 420. The loop filter 430 filters relatively high-frequency changes of the control current to generate a filtered control. Such an operation may be referred to as averaging or smoothing. For example, the loop filter 430 may be a resistor-capacitor filter configured to reduce amplitudes of changes to the control current for frequencies greater than a cut-off frequency. The loop filter 430 supplies the filtered control to the amplifier 440.

The amplifier 440 is coupled to the loop filter 430 and the buffers 450-480. The amplifier 440 is a difference amplifier configured to supply a control voltage (VCTRL) to the buffers 450-480. The amplifier 440 increases a signal strength of the control voltage. The amplifier 440 supplies the control voltage to the buffers 450-480. Advantageously, the amplifier 440 ensures that power consumption of the buffers 450-480 does not affect the control voltage.

The first buffer 450 is coupled to the controller 105, the de-skew circuitry 115 of FIG. 1, the amplifier 440, and the second buffer 460. The first buffer 450 receives the reference clock from the controller 105. The reference clock from the controller 105 may be referred to as a first delayed clock (DLY[0]), which is approximately equal to the reference clock. The first buffer generates a second delayed clock (DLY[1]) by adding a propagation delay to the reference clock from the controller 105. The propagation delay is based on the control voltage from the amplifier 440. For example, the first buffer 450 delays the reference clock by a first delay in response to a first control voltage of a first voltage and delays the reference clock by a second delay in response to a second control voltage of a second voltage. In such examples, the first voltage and the second voltage modify the propagation delay of the first buffer 450 to generate the first and second delays. Such a buffer may be referred to as a voltage controlled buffer. The first buffer 450 supplies the second delayed clock to the de-skew circuitry 115 and the second buffer 460.

The second buffer 460 is coupled to the de-skew circuitry 115, the amplifier 440, and the first buffer 450. The second buffer 460 is configured to be coupled to the third buffer 470 by a plurality of buffers (not illustrated for simplicity) coupled in series. In some examples, the second buffer 460 is coupled to the third buffer 470 by sixty buffers coupled in series and to the control voltage from the amplifier 440. The second buffer 460 generates a third delayed clock (DLY[2])

by adding the propagation delay to the second delayed clock from the first buffer 450. The propagation delay of the second buffer 460 is approximately equal to the propagation delay of the first buffer 450. The second buffer 460 supplies the second delayed clock to the de-skew circuitry 115 and the third buffer 470.

The third buffer 470 is coupled to the de-skew circuitry 115, the amplifier 440, the second buffer 460, and the fourth buffer 480. The third buffer 470 generates a fourth delayed clock (DLY[63]) by adding the propagation delay to the second delayed clock from the second buffer 460. The propagation delay of the third buffer 470 is approximately equal to the propagation delay of the buffers 450 and 460. The third buffer 470 supplies the third delayed clock to the de-skew circuitry 115 and the fourth buffer 480.

The fourth buffer 480 is coupled to the PFD 410, the amplifier 440, and the third buffer 470. The fourth buffer 480 generates a fourth delayed clock, which is approximately in phase with the reference clock, by adding the propagation delay to the third delayed clock from the third buffer 470. The propagation delay of the fourth buffer 480 is approximately equal to the propagation delay of the buffers 450-470. The fourth buffer 480 supplies the fourth delayed clock to the PFD 410.

In the example of FIG. 4, the buffers 450-480 are illustrated and discussed. Alternatively, the DLL circuitry 155 may include any plurality of the buffers 450-480 coupled in series. For example, the DLL circuitry 155 may include sixty-four buffers coupled in series between the reference clock from the controller 105 and the PFD 410. In such an example, the DLL circuitry 155 generates sixty-four delayed clocks (DLY[63:0]).

In example operation, the PFD 410 generates voltage pulses to modify the control voltage from the amplifier 440 until the fourth delayed clock signal from the fourth buffer 480 is in phase with the reference clock from the controller 105. Advantageously, the plurality of delayed clocks generated by the DLL circuitry 155 include delays up to a cycle of the reference clock.

Figure 5:
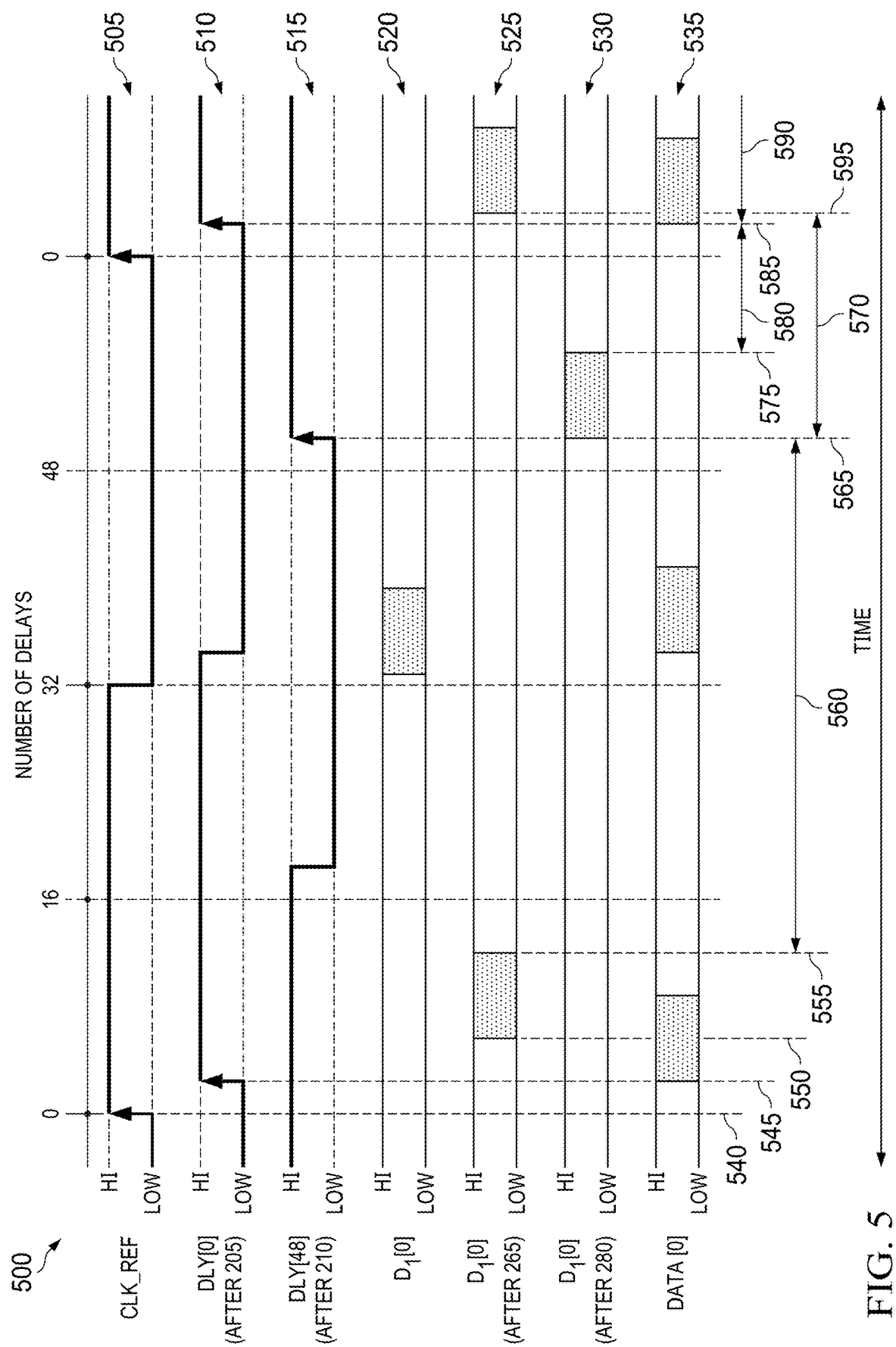
FIG. 5 is timing diagram of an example operation of the de-skew circuitry of FIG. 1.

FIG. 5 is a timing diagram 500 of an example operation of the retimer circuitries 125, 135, and 145 of FIGS. 1 and/or 2 and 300 of FIG. 3. In the example of FIG. 5, the timing diagram 500 includes an example reference clock (CLK_REF) 505, a first example delayed clock (DLY[0]) 510, a second example delayed clock (DLY[48]) 515, an example data stream (D₁[0]) 520, an example latched data stream 525, an example multiplexed data stream 530, and an example retimed data stream (DATA[0]) 535. The timing diagram 500 illustrates operations when the DLL circuitry 155 of FIGS. 1 and 4 is configured to generate sixty-four delayed clock signals (DLY[63:0]). In such a configuration, the DLL circuitry 155 includes sixty-four buffers (e.g., the buffers 450-480 of FIG. 4) coupled in series between the reference clock 505 from the controller 105 of FIG. 1 and the PFD 410 of FIG. 4.

The controller 105 generates the reference clock 505. The controller 105 supplies the reference clock 505 to the DLL circuitry 155. The DLL circuitry 155 generates delayed versions of the reference clock 505 using the control voltage from the amplifier 440 of FIG. 4 to set a propagation delay of the buffers 450-480. In the example of FIG. 5, a rising edge of the reference clock 505 corresponds to zero delay (DLY[0]) and just before a subsequent rising edge corresponds to sixty-three delays (DLY[63]), such delays corresponding to the propagation delay of one of the buffers 450-480.

The first multiplexer 205 of FIG. 2 supplies the first delayed clock 510 from the DLL circuitry 155 to the channel circuitry 215 and 220 of FIG. 2 and the second multiplexer 225 of FIG. 2. The propagation delay of the first multiplexer 205 delays the reference clock 505 to generate the first delayed clock 510.

The first delay circuitry 210 of FIG. 2 supplies the second delayed clock 515 from the DLL circuitry 155 to the channel circuitry 215 and 220. The propagation delays of forty-eight buffers of the DLL circuitry 155 and the first delay circuitry 210 delay the reference clock 505 to generate the second delayed clock 515.

The controller 105 generates the data stream 520 to transmit data to the SLM 110 of FIG. 1. The controller 105 supplies the data stream 520 to the second channel circuitry 220 of the first retimer circuitry 125.

The fifth flip-flop 260 of FIG. 2 and the third delay circuitry 265 of FIG. 2 generate the latched data stream 525 by latching and delaying the data stream 520. The fourth multiplexer 280 generates the multiplexed data stream 530 based on the MSB of the select delay bits from the controller 105 and inputs from the flip-flops 270 and 275 of FIG. 2. The first retimer circuitry 125 generates the retimed data stream 535 by serializing and delaying data from the controller 105.

At a first time 540, the reference clock 505 has a rising edge (e.g., a transition from a logic low (LOW) to a logic high (HI)). The first time 540 corresponds to zero delay. At a second time 545, the first delayed clock 510 has a rising edge. The time between the times 540 and 545 is approximately the propagation delay of the first multiplexer 205.

At a third time 550, the latched data stream 525 has data from the third delay circuitry 265. At a fourth time 555, the latched data stream 525 no longer receives data from the third delay circuitry 265. At the fourth time 555, the third delay circuitry 265 no longer generates data in response to a beginning of a first example setup duration 560 of the sixth flip-flop 270. The first setup duration 560 of the sixth flip-flop 270 corresponds to portions of the second delayed clock 515 where the second channel circuitry 220 no longer accurately latches data from third delay circuitry 265. Although in the example of FIG. 5, the first setup duration 560 begins at the fourth time 555, the first setup duration 560 may begin at a time determined by a setup time characteristic of the sixth flip-flop 270 and prior to a subsequent rising edge of the second delayed clock 515.

At a fifth time 565, the first setup duration 560 of the sixth flip-flop 270 ends on a rising edge of the second delayed clock 515. The rising edge of the second delayed clock 515 causes an end to the first setup duration 560. At the fifth time 565, a first example hold duration 570 of the sixth flip-flop 270 begins. The first hold duration 570 is a duration in time following the rising edge of the second delayed clock 515 before the sixth flip-flop 270 may begin to accurately latch data from the third delay circuitry 265, such as at the third time 550. The first hold duration 570 is a hold time characteristic of the sixth flip-flop 270. At the fifth time 565, the sixth flip-flop 270 supplies latched data to the seventh flip-flop 275 and the fourth multiplexer 280. During the first hold duration 570, the sixth flip-flop 270 may supply data to the seventh flip-flop 275 and the fourth multiplexer 280. At the fifth time 565, the multiplexed data stream 530 represents data from the sixth flip-flop 270 in response to the select delay bits from the controller 105 representing a delay which is less than half of a cycle of the reference clock 505.

At a sixth time 575, the multiplexed data stream 530 no longer supplies data to the eighth flip-flop 285. At the sixth time 575, a second example setup duration 580 begins. The second setup duration 580 is based on a startup characteristic of the eighth flip-flop 285 and the first multiplexer 205. In the example of FIG. 5, the first multiplexer 205 supplies the first delayed clock 510 to the eighth flip-flop 285. The second setup duration 580 ends on a subsequent rising edge of the first delayed clock 510. The sixth time 575 may be determined by predicting the subsequent rising edge after a time of the second setup duration 580.

At a seventh time 585, the second setup duration 580 ends in response to a rising edge of the first delayed clock 510. At the seventh time 585, a second example hold duration 590 begins. The second hold duration 590 is based on a hold characteristic of the eighth flip-flop 285 and the first multiplexer 205. In the example of FIG. 5, the hold duration 590 begins on a rising edge of the first delayed clock 510 while the first multiplexer 205 is configured to supply the first delayed clock 510. At the seventh time 585, the retimed data stream 535 represents data from the eighth flip-flop 285.

At an eighth time 595, the first hold duration 570 ends. The eighth time 595 is based on a hold time characteristic of the sixth flip-flop 270 and the fifth time 565.

Advantageously, timing margins of the first retimer circuitry 125 may be modified by modifying which of the plurality of delayed clocks the first multiplexer 205 and the first delay circuitry 210 supply to the channel circuitry 215 and 220.

Figure 6:
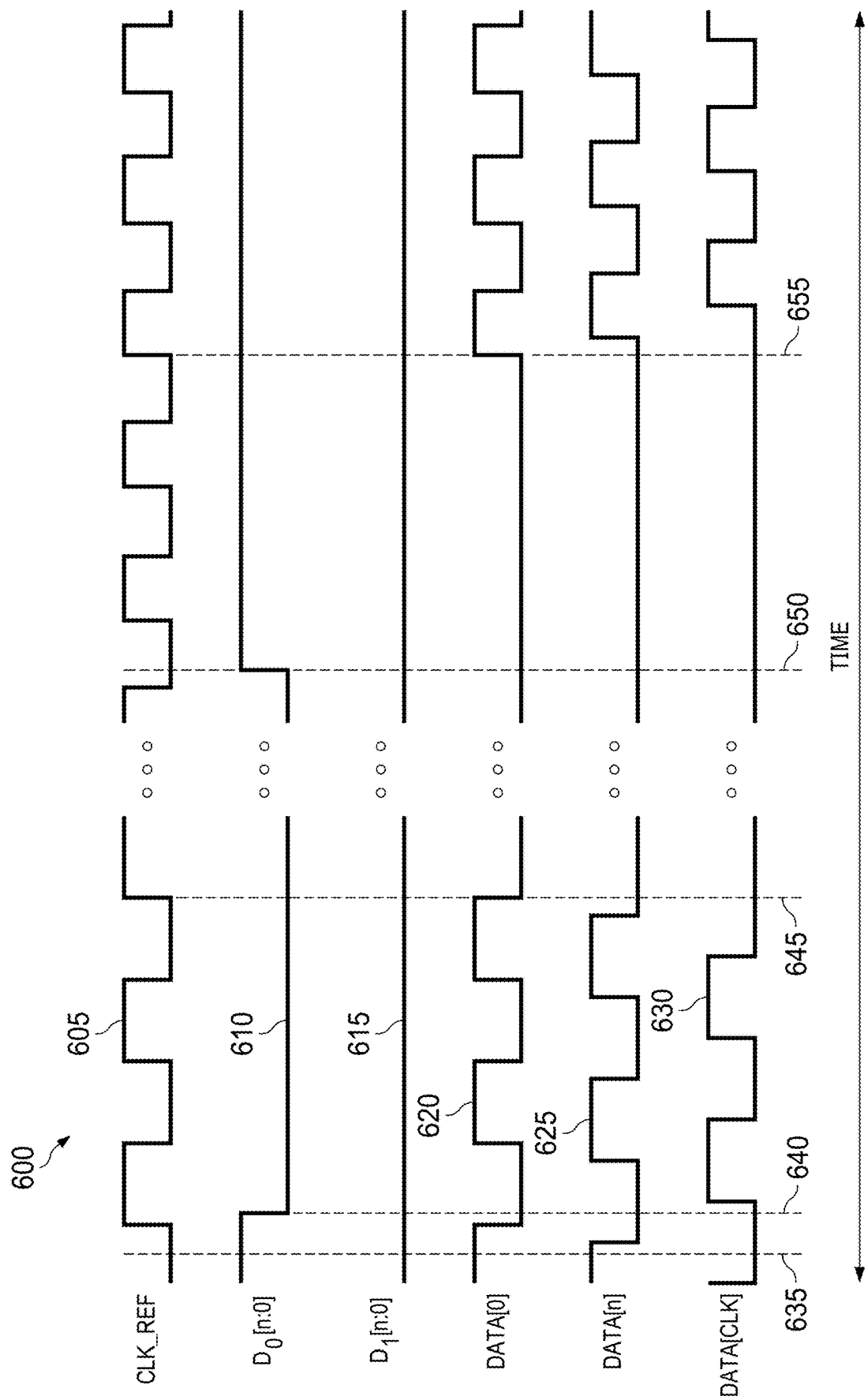
FIG. 6 is a timing diagram of an example operation to modify a delay of the retimer circuitry of FIGS. 1 and 2.

FIG. 6 is a timing diagram 600 of an example operation of the de-skew circuitry 115 of FIG. 1 and the retimer circuitries 125, 135, and 145 of FIGS. 1 and/or 2 and 300 of FIG. 3. In the example of FIG. 6, the timing diagram 600 includes an example reference clock (CLK_REF) 605, a first example data stream ($D_0[n:0]$) 610, a second example data stream ($D_1[n:0]$) 615, a first example retimed data stream (DATA[0]) 620, a second example retimed data stream (DATA[n]) 625, and a third example retimed data stream (DATA[CLK]) 630. The timing diagram 600 illustrates modifying delays of the de-skew circuitry 115 with reduced glitches.

The reference clock 605 represents the reference clock generated by the controller 105 of FIG. 1. The first data stream 610 represents data supplied to the retimer circuitry 125, 135, and 145 of FIGS. 1 and 2 by the controller 105 on the first data streams. The second data stream 615 represents data supplied to the retimer circuitry 125, 135, and 145 by the controller 105 on the second data streams.

The first retimed data stream 620 represents the retimed data stream from the first retimer circuitry 125. The second retimed data stream 625 represents the retimed data from the second retimer circuitry 135. The third retimed data stream 630 represents the retimed data stream from the third retimer circuitry 145.

At a first time 635, the first data stream 610 is a logic high and the second data stream 615 is a logic low. At the first time 635, the retimer circuitry 125, 135, and 145 serialize and delay the data streams 610 and 615 to generate the retimed data streams 620-630. For example, the delayed clock signal from the first multiplexer 205 of FIG. 2 causes the first retimer circuitry 125 to switch between data from the channel circuitry 215 and 220 of FIG. 2 approximately every half of a cycle of a delayed clock from the DLL circuitry 155 of FIGS. 1 and 4. In such examples, the retimed data streams 620-630 resemble delayed versions of the reference clock 605.

At a second time 640, the controller 105 sets the first data stream 610 equal to the second data stream 615. After the second time 640, the retimer circuitry 125, 135, and 145 begin to latch and serialize the data streams 610 and 615 to fix the retimed data streams 620-630 to a set value. In some examples, the controller 105 may set the second data stream 615 to a logic level of the first data stream 610. In such an example, at the second time 640, the second data stream 615 is set to a logic high. At a third time 645, the retimed data streams 620-630 have all latched the first data stream 610 as set at the second time 640. After the third time 645, the retimed data streams 620-630 are set equal to a logic zero in response to the data streams 610 and 615 being set equal to a logic zero by the controller 105. Following the third time 645, the controller 105 may modify the select delay bits for the retimer circuitry 125, 135, and/or 145. Advantageously, modifying the select delay bits while the data streams 610 and 620 and the retimed data streams 620-630 are set to a common value prevents glitches (e.g., incorrect data transmissions, typically caused by timing errors).

At a fourth time 650, the first data stream 610 is set equal to a logic one. After the fourth time 650, the retimer circuitry 125, 135, and 145 begin to latch the first data stream 610 as set at the fourth time 650. Alternatively, either of the data streams 610 and 620 may be set to any value following the fourth time 650. For example, the controller 105 may configure the data streams 610 and 620 to transmit test data to the SLM 110 of FIG. 1.

At a fifth time 655, the retimed data streams 620-630 begin to transmit serialized and delayed streams of the data streams 610 and 615 from the third time 640. Advantageously, the delays of the retimed data streams 620-630 were modified without generating glitches.

Figure 7:
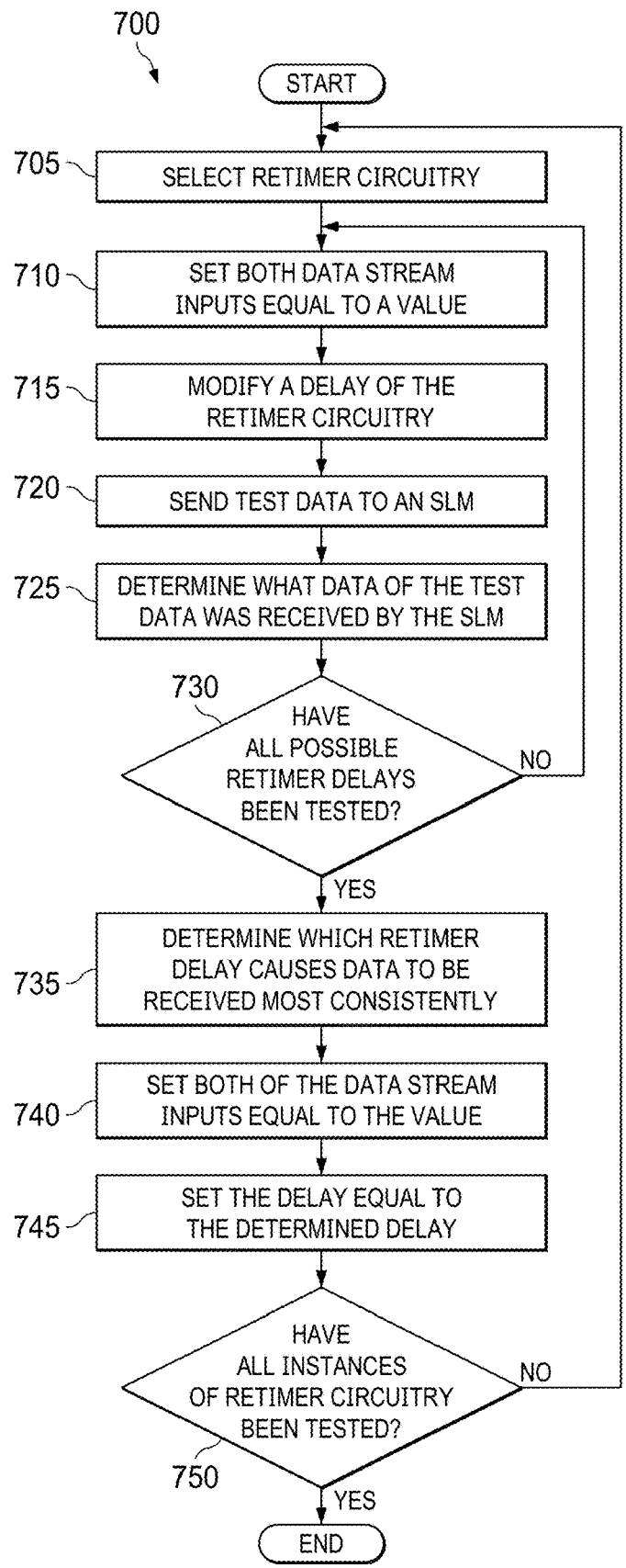
FIG. 7 is a flowchart representative of an example process that may be performed using machine readable instructions that can be executed and/or hardware configured to modify a delay of the retimer circuitry of FIGS. 1, 2, and 3 with reduced glitch.

FIG. 7 is a flowchart representative of an example process that may be performed using machine-readable instructions that can be executed and/or hardware configured to implement the de-skew circuitry 115 of FIG. 1 to modify a delay of the retimer circuitry 125, 135 and/or 145 of FIGS. 1 and 2 with reduced glitch. The machine-readable instructions and/or the operations 700 of FIG. 7 begin at block 705, at which the controller 105 of FIG. 1 selects retimer circuitry. (Block 705). In some examples, the controller 105 selects one of the retimer circuitry 125, 135, 145 and/or 300. The control proceeds to Block 710.

The controller 105 sets both data stream inputs (e.g., $D_0[0]$ and $D_1[0]$, $D_0[n]$ and $D_1[n]$, and/or $D_0[clk]$ and $D_1[clk]$) equal to a value. (Block 710). In some examples, the controller 105 sets the plurality of data streams equal to a logic one or a logic zero as the value. In such example, the controller 105 may wait for the value to be latched by all of the flip-flops (e.g., the flip-flops 230, 240, 245, 255, 260, 270, 275, and/or 285 of FIG. 2) of both channels (e.g., the channel circuitry 215 and 220 of FIG. 2). For example, the controller 105 may set the first and second data streams ($D_0[0]$ and $D_1[0]$) equal to a logic zero and wait two cycles of the reference clock 505. The control proceeds to Block 715.

The controller 105 modifies a delay of the retimer circuitry. (Block 715). In some examples, the controller 105 modifies at least one of the plurality of select delay bits ($SEL\_DLY_n[5:0]$) to modify the delay of the de-skew circuitry 115 of FIG. 1. In such examples, the modified select delay bits configure the first multiplexer 205 of FIG. 2 to supply a different one of the delayed clock signals from the DLL circuitry 155 of FIGS. 1 and 4 to the channel circuitry 215 and 220. The control proceeds to Block 720.

The controller 105 sends test data to the SLM 110 of FIG. 1. (Block 720). In some examples, the controller 105 supplies the test data to the first retimer circuitry 125 by supplying a portion of the test data to each of the data streams. In such examples, the first retimer circuitry 125 is configured to delay and serialize the data streams to supply retimed test data to the SLM 110. The control proceeds to Block 725.

The controller 105 determines what data of the test data was received by the SLM 110. (Block 725). In some examples, the SLM 110 indicates to the controller 105 a number of bits of the test data were not received. The control proceeds to Block 730.

The controller 105 determines if all possible retimer delays have been tested. (Block 730). In some examples, the controller 105 uses previous indications of received data from the SLM 110 to determine what delays have been tested. In other examples, the controller 105 determines all of the possible retimer delays to include all of the plurality of delayed clocks generated by the DLL circuitry 155. If the controller 105 determines that all possible delays have not been tested (e.g., Block 730 returns a result of NO), the control proceeds to Block 710 to test delays that have not been previously tested.

If the controller 105 determines that all possible delays have been tested (e.g., Block 730 returns a result of YES), the controller 105 determines which retimer delay causes data to be received most consistently. (Block 735). In some examples, the controller 105 determines which of the possible delays corresponds to the most received data at Block 725. In other examples, the controller 105 determines which of the possible delays maximizes timing margins. For example, the controller 105 may determine that out of three delays that had the same result for Block 725, that the one between the other two corresponds to the best timing margin. The control proceeds to Block 740.

The controller 105 sets both of the data stream inputs equal to the value, from Block 710. (Block 740). Similar to the operations at Block 740, the controller 105 may latch the value into the flip-flops of both of the channel circuitry 215 and 220 before proceeding. The control proceeds to Block 745.

The controller 105 sets the delay of the retimer circuitry to the determined delay from Block 735. (Block 745). Similar to the operations at Block 715, the controller 105 set the delay of the first retimer circuitry 125 by setting the select delay bits corresponding to the first retimer circuitry 125 to a value which represents the determined delay. The control proceeds to Block 750.

The controller 105 determines if all instances of retimer circuitry (e.g., retimer circuitry 125, 135, and 145) have been tested. (Block 750). In some examples, the controller 105 may determine if all sets of select delay bits have been set. In other examples, the controller 105 may track which instances of the retimer circuitry 125, 135, 145 and/or 130 have been tested. If the controller 105 determines that all instances of the retimer circuitry have not been tested (e.g., Block 750 returns a result of NO), the control proceeds to Block 705 to test instances of retimer circuitry that have yet to be tested. If the controller 105 determines that all instances of the retimer circuitry have been tested (e.g., Block 750 returns a result of YES), the control proceeds to end.

Advantageously, delays of the de-skew circuitry 115 may be modified with minimal glitch using the retimer circuitry 125, 135, 145 and/or 300 and a process of setting the data streams equal to a shared value, prior to the modification of the select delay bits.

Although example processes are described with reference to the flowchart illustrated in FIG. 7, many other methods of modifying a delay of retimer circuitry may alternatively be used in accordance with teachings of this disclosure. For example, the order of execution of the blocks may be changed, and/or some of the blocks described may be changed, eliminated, or combined. Similarly, additional operations may be included in the manufacturing process before, in between, or after the blocks shown in the illustrated examples.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Further-more, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. A circuit comprising:
a first flip-flop having a first flip-flop terminal, a second flip-flop terminal, and a third flip-flop terminal;
first delay circuitry having a first delay terminal and a second delay terminal, the first delay terminal coupled to the second flip-flop terminal;
second delay circuitry having a third delay terminal and a fourth delay terminal;
a second flip-flop having a fourth flip-flop terminal, a fifth flip-flop terminal, and a sixth flip-flop terminal, the fourth flip-flop terminal coupled to the second delay terminal and the fifth flip-flop terminal coupled to the fourth delay terminal;
a third flip-flop having a seventh flip-flop terminal, an eighth flip-flop terminal, and a ninth flip-flop terminal, the seventh flip-flop terminal coupled to the fifth flip-flop terminal and the ninth flip-flop terminal coupled to the fourth delay terminal; and
a multiplexer having a first multiplexer input, a second multiplexer input, and a multiplexer output, the first multiplexer input coupled to the fifth flip-flop terminal and the second multiplexer input coupled to the eighth flip-flop terminal.

2. The circuit of claim 1, further comprising delay locked loop (DLL) circuitry coupled to the third flip-flop terminal and to the third delay terminal.

3. The circuit of claim 2, wherein the DLL circuitry comprises a plurality of buffers coupled in series, wherein a propagation delay of each of the buffers is based on a control voltage.

4. The circuit of claim 3, wherein the buffers are configured to generate delays by dividing a cycle of a reference clock by a number of the buffers.

5. The circuit of claim 1, wherein the multiplexer is a first multiplexer and the multiplexer output is a first multiplexer output, the circuit further comprising:
a second multiplexer having a third multiplexer input and a second multiplexer output; and
a fourth flip-flop having a tenth flip-flop terminal, an eleventh flip-flop terminal, and a twelfth flip-flop terminal, the tenth flip-flop terminal coupled to the first multiplexer output and the twelfth flip-flop terminal coupled to the second multiplexer output.

6. The circuit of claim 5, wherein first channel circuitry comprises the first flip-flop, the second flip-flop, the third flip-flop, the first delay circuitry, and the first multiplexer, and wherein the circuit further comprises:
second channel circuitry coupled to the third flip-flop terminal, the sixth flip-flop terminal, and the twelfth flip-flop terminal; and
a third multiplexer having a fifth multiplexer input, a sixth multiplexer input, a seventh multiplexer input, and a third multiplexer output, the fifth multiplexer input coupled to the second channel circuitry, the sixth multiplexer input coupled to the eleventh flip-flop terminal, and the seventh multiplexer input coupled to the twelfth flip-flop terminal.

7. The circuit of claim 1, further comprising:
a fifth flip-flop having a thirteenth flip-flop terminal, a fourteenth flip-flop terminal, and a fifteenth flip-flop terminal, the thirteenth flip-flop terminal coupled to the third flip-flop terminal and the fourteenth flip-flop terminal coupled to the first delay terminal; and
a buffer having a buffer input and a buffer output, the buffer input coupled to the second flip-flop terminal and the buffer output coupled to the fifteenth flip-flop terminal.

8. A method comprising:
setting, by a transmitter, a retimer circuitry to have a first delay;
transmitting, by the transmitter to a receiver, first test data comprising sending the first test data to the retimer circuitry while the retimer circuitry has the first delay;
determining, by the transmitter, success of transmitting the first test data;
setting, by the transmitter, the retimer circuitry to have a second delay, after transmitting the first test data;
transmitting, by the transmitter to the receiver, second test data comprising transmitting the second test data to the retimer circuitry while the retimer circuitry has the second delay;
determining, by the transmitter, success of transmitting the second test data; and
setting, by the transmitter, the retimer circuitry to have a determined delay based on the success of transmitting the first test data and the success of transmitting the second test data.

9. The method of claim 8, further comprising:
setting a first data stream to a value before transmitting the first test data;
setting a second data stream to the value before transmitting the second test data; and
setting a third data stream to the value before setting the retimer circuitry to have the determined delay.

10. The method of claim 8, wherein the retimer circuitry is first retimer circuitry and the determined delay is a first determined delay, the method further comprising:
setting, by the transmitter, second retimer circuitry to have a third delay;
transmitting, by the transmitter to the receiver, third test data comprising sending the third test data to the first retimer circuitry and to the second retimer circuitry while the second retimer circuitry has the third delay;
determining, by the transmitter, success of transmitting the third test data;
setting, by the transmitter, the second retimer circuitry to have a fourth delay, after transmitting the third test data;
transmitting, by the transmitter to the receiver, fourth test data comprising transmitting the second test data to the first retimer circuitry and the second retimer circuitry while the second retimer circuitry has the fourth delay;
determining, by the transmitter, success of transmitting the fourth test data; and
setting, by the transmitter, the second retimer circuitry to have a second determined delay based on the success of transmitting the third test data and the success of transmitting the fourth test data.

11. The method of claim 8, wherein determining the success of transmitting the first test data comprises receiving, by the transmitter, a number of bits of the first test data received by the receiver.

12. The method of claim 8, wherein determining the success of transmitting the first test data comprises determining timing margins.

13. A system comprising:
a controller having a first controller terminal, a second controller terminal, and a third controller terminal;
delay locked loop (DLL) circuitry having a first DLL terminal and a second DLL terminal, the first DLL terminal coupled to the first controller terminal;
first retimer circuitry having a first retimer terminal, and a second retimer terminal, and a third retimer terminal, the first retimer terminal coupled to the second DLL terminal and the second retimer terminal coupled to the second controller terminal; and
second retimer circuitry having a fourth retimer terminal, a fifth retimer terminal, and a sixth retimer terminal, the fourth retimer terminal coupled to the second DLL terminal and the fifth retimer terminal coupled to the third controller terminal.

14. The system of claim 13, wherein:
the DLL circuitry is configured to generate a plurality of delayed clocks at a plurality of delayed clock terminals comprising the second DLL terminal based on a reference clock received at the first DLL terminal;
the first retimer circuitry is configured to delay and serialize first data received at the second retimer terminal using at least one of the delayed clocks; and
the second retimer circuitry is configured to delay and serialize second data of the fifth retimer terminal using at least one of the delayed clocks of the plurality of delayed clock terminals.

15. The system of claim 14, wherein the first retimer circuitry is configured to delay the first data by a first delay, the second retimer circuitry is configured to delay the second data by a second delay, the first delay and the second delay based on one of the plurality of delayed clocks of the delayed clock terminals.

16. The system of claim 13, further comprising:
a first buffer having a first buffer input and a first buffer output, the first buffer input coupled to the third retimer terminal; and
a second buffer having a second buffer input and a second buffer output, the second buffer input coupled to the sixth retimer terminal.

17. The system of claim 16, further comprising:
a first transmission line coupled to the first buffer output; and
a second transmission line coupled to the second buffer output.

18. The system of claim 13, wherein the first retimer circuitry comprises:
a first flip-flop having a first flip-flop terminal, a second flip-flop terminal, and a third flip-flop terminal;
first delay circuitry having a first delay terminal and a second delay terminal, the first delay terminal coupled to the second flip-flop terminal;
second delay circuitry having a third delay terminal and a fourth delay terminal;
a second flip-flop having a fourth flip-flop terminal, a fifth flip-flop terminal, and a sixth flip-flop terminal, the fourth flip-flop terminal coupled to the second delay terminal and the fifth flip-flop terminal coupled to the fourth delay terminal;
a second flip-flop having a seventh flip-flop terminal, an eighth flip-flop terminal, and a ninth flip-flop terminal, the seventh flip-flop terminal coupled to the fifth flip-flop terminal and the ninth flip-flop terminal coupled to the fourth delay terminal; and
a multiplexer having a first multiplexer input, a second multiplexer input, and a multiplexer output, the first multiplexer input coupled to the fifth flip-flop terminal and the second multiplexer input coupled to the eighth flip-flop terminal.

19. The system of claim 13, wherein the first retimer circuitry comprises:
coarse delay circuitry coupled to the first retimer terminal and to the second retimer terminal; and
fine delay circuitry coupled to the coarse delay circuitry, to the second retimer terminal, and to the third retimer terminal.

20. The system of claim 13, wherein the first retimer circuitry comprises:
first channel circuitry configured to generate first retimed data;
second channel circuitry configured to generate second retimed data; and
a multiplexer configured to serialize the first retimed data and the second retimed data.

* * * * *